United States Patent [19]
Buijs et al.

[11] Patent Number: 5,413,104
[45] Date of Patent: May 9, 1995

[54] INVASIVE MRI TRANSDUCERS

[75] Inventors: Arnold Buijs, Eindhoven; Wim Abrahams, Hilvarenbeek, both of Netherlands

[73] Assignee: Drager Medical Electronics B.V., Netherlands

[21] Appl. No.: 149,072

[22] Filed: Nov. 9, 1993

[30] Foreign Application Priority Data

Nov. 10, 1992 [NL] Netherlands .......................... 9201965

[51] Int. Cl.$^6$ ............................................. A61B 5/055
[52] U.S. Cl. ................................................... 128/653.5
[58] Field of Search .......... 128/653.2, 653.5, 656–658, 128/772, 642; 604/21, 96; 607/116, 122

[56] References Cited

U.S. PATENT DOCUMENTS

| | | | |
|---|---|---|---|
| 5,035,231 | 7/1991 | Kubokawa et al. | 128/653.5 |
| 5,050,607 | 9/1991 | Bradley et al. | 128/653.5 |
| 5,170,789 | 12/1992 | Narayan et al. | 128/653.5 |
| 5,307,814 | 3/1994 | Kressel et al. | 128/653.5 |

FOREIGN PATENT DOCUMENTS 0385367  9/1990  European Pat. Off. .

Primary Examiner—Ruth S. Smith
Attorney, Agent, or Firm—Brumbaugh, Graves, Donohue & Raymond

[57] ABSTRACT

Coil assembly for a probe destined to become inserted in a body cavity of a patient, said coil assembly cooperating with a magnetic resonance system for making images within the respective body cavity, said probe comprising an elongated shaft comprising at least one lumen, an inflatable balloon of flexible material, which at its front and aft side is connected to said elongated shaft and can be inflated through the at least one lumen therein, and a flexible coil connected to a communication cable running through said at least one lumen in said elongated shaft. Two elongated tubular stiff coil conductors are connected to said balloon such that both coil connectors are extending parallel to said elongated shaft and that the coil runs through said coil conductors.

4 Claims, 2 Drawing Sheets

INVASIVE MRI TRANSDUCERS

The invention relates to a probe destined to become inserted in a body cavity of a patient, said probe comprising:
- an elongated shaft comprising at least one lumen, extending from the proximal end of the shaft to near the distal end thereof where said lumen leads to an opening in said shaft
- an inflatable balloon of flexible material positioned around the distal section of said elongated shaft such that the distal and proximal sections of said balloon are connected to said elongated shaft sealing the balloon and such that the opening in said shaft communicates with the inner space of the balloon for inflating/draining the balloon through said at least one lumen, and
- a coil comprising a loop shaped flexible wire attached to the balloon, the ends of said wire being connected to a communication cable running through said at least one lumen in said elongated shaft said coil assembly cooperating with a magnetic resonance system for making images within the respective body cavity.

Such a coil assembly is described in the European patent application EP-0,385,367. In one of the therein described embodiments the balloon consists in fact of an outer balloon and a separate inner balloon. The coil is attached to a relatively stiff section of the inner balloon and, during the inflation of said inner balloon, will become pressed against the inner wall of the outer balloon. In another embodiment, in which only one balloon is used, the coil wire is attached or adhered to the inner wall of said single balloon. A further embodiment is described in which the balloon comprises at least two mutually attached layers, whereby the coil wire is embedded in between both layers.

Coils of this type are used to make MRI-images in various body cavities, such as the rectum, the oesophagus, the vagina, etc. It is thereby important that the coil, after it is brought into its position in the respective body cavity and after the balloon is inflated through the respective lumen in the elongated shaft, has an unambiguously defined shape. Distortions of the desired shape appear to have a significant influence on the quality and the reproducibility of the MRI images.

In the ideal case the coil has in the inflated situation of said coil such a shape that at least two wire sections are running parallel to the longitudinal shaft of the probe and are extending linearly parallel to the shaft and at a fixed known distance thereof.

In both respects the known configuration has the disadvantage that the shape of the balloon will alter dependent on the pressure of the inflating gas. Especially, it is not inconceivable that the balloon at a slight overpressure will start to bulge out so that the respective wire sections of the coil, which will follow the balloon wall, are not extending in a linear path but will run along a somewhat spherical path. This has an adverse influence on the quality and reproducibility of the magnetic resonance image which can be made with such a coil. Although this disadvantage is partly eliminated in the known embodiment in which the coil is connected to a relatively stiff section of the inner balloon, this embodiment has another disadvantage because use has to be made of a separate inner balloon with a relatively stiff section in combination with a separate outer balloon.

Another prior art type of coil assembly is described in U.S. Pat. No. 5050607. The therein described embodiment comprises an inflatable balloon sealed at its ends around an exterior section of the elongated tube so that the tube passes through the diameter of the balloon. A coil wire emerges from the tip of the tube, passes over the outer wall of the tube and around the exterior of the inflatable balloon. The portion of the coil farthest from the tip of the tube passes around one side of the tube. The embodiment comprises furthermore a separate outer balloon covering part of the coil assembly during operation.

The shape of the coil assembly in this prior art embodiment is rather complicated and does not comprise mutually parallel sections. Disinfecting and sterilizing the assembly will be problematic especially because of the open end of the elongated tube through which the coil wire emerges.

Other prior art embodiments resembling those of EP 0385367 are described in U.S. Pat. No. 5035231. FIGS. 19 and 20 show an inflatable balloon with a coil wire embedded in the wall thereof. A similar embodiment is shown in FIGS. 22-26 the difference residing in the shape of the coil.

An object of the invention is now to provide a coil assembly for a probe embodied such that the above-mentioned disadvantages are avoided.

SUMMARY OF THE INVENTION

In agreement with said object the coil assembly of the above-mentioned type is now according to the invention characterized in that two elongated tubular stiff coil conductors are attached to said balloon such that in the inflated condition of the balloon both coil connectors are extending parallel to said elongated shaft and that part of the coil extends through said coil conductors.

Although it is possible to adhere or attach said two elongated tubular stiff coil conductors to the wall of the balloon, more specifically the inner wall of the balloon, by means of a suitable adhesive or glue or in another way, it is preferred that the coil conductors are integrally embedded in the balloon wall. Therefore a preferred embodiment of the coil assembly is characterized in that the balloon comprises two inwards directed elongated ribs, in each of which one of said coil conductors is embedded at least partly.

In many cases it is preferred that the coil surrounds an area as large as possible. It is therefore preferred that in the inflated situation of the balloon the coil conductors and the elongated shaft are substantially positioned in one plane.

In the following part of the description the invention will be explained in more detail with reference to the attached drawings.

DETAILED DESCRIPTION OF THE INVENTION

The assembly illustrated in the figures comprises an inflatable balloon 10, which is made of a flexible material. The balloon 10 is positioned around the distal part of an elongated shaft 12 which is not illustrated completely in the figure and of which the use and the actual embodiment are considered as known to the expert in this field. Said shaft comprises at least one lumen 11 for transferring the gas by means of which the balloon will be inflated and for guiding the connecting cable which, during operation of the probe, has to be connected with the coil which will be described hereinafter.

Figure 2:
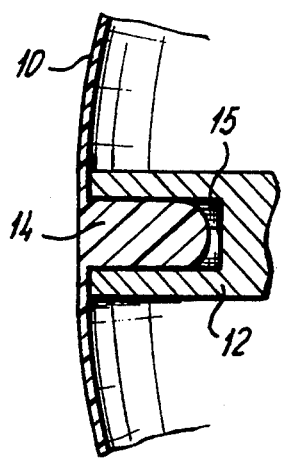
FIG. 2 illustrates a cross section in which the attachment of the distal end of the balloon to the elongated shaft is illustrated.

As appears from the figures the balloon has in the inflated condition a somewhat elongated cylindrical shape with semispherical end sections. The proximal semispherical end section extends to within a tubular section 13 which fits closely around the shaft 12. Preferably mechanical mounting means (not illustrated in the figure) such as a clamp or something similar are present to guarantee an airtight connection between the balloon 10 and the shaft 12. The distal end section of the balloon 10 comprises at its inner wall an inwards directed bulge 14 which has in general a cylindrical shape. The distal end section of the shaft 12 comprises a cylindrical excavation 15 of which the inner diameter at least approximately corresponds to the outer diameter of said bulge 14. As illustrated in FIG. 2 the distal end section of the balloon 10 is connected to the shaft 12 by pressing the bulge 14 tightly into the excavation 15.

Figure 1:
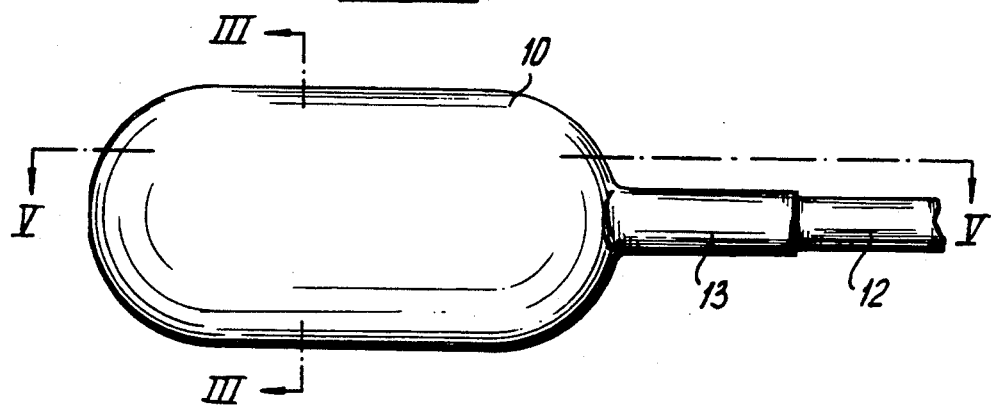
FIG. 1 illustrates a view on a balloon according to the invention.
Figure 3:
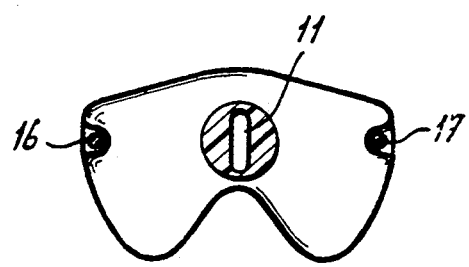
FIG. 3 illustrates a cross section through the balloon in the non-inflated condition.

FIG. 3 illustrates a cross section according to the arrows III—III in FIG. 1. In this cross section the balloon is shown in its not inflated condition. On the one hand it appears from this figure that in the respective preferred embodiment the shaft 12 comprises only one single lumen 11 which has in cross section a somewhat elongated and approximately oval shape. Because of said shape it is possible to run on the one hand the connection cable to the coil through said lumen whereas on the other hand enough space will be kept open to press therethrough the inflating gas in the balloon. Instead of one single lumen it is of course possible to apply more lumens, one of which can be used for guiding the coil connecting cable and another of which can be used for supplying or draining the inflating gas. As appear furthermore from FIG. 3 two inwards directed protrusions or ribs 16 and 17 are provided on the inner wall of the balloon 10, approximately diametrically opposite each other, which ribs extend parallel to the shaft 12. Each of said ribs comprises an opening in which a tubular relatively stiff coil conductor 19 respectively 18 is inserted. More details are provided in FIG. 4.

Figure 4:
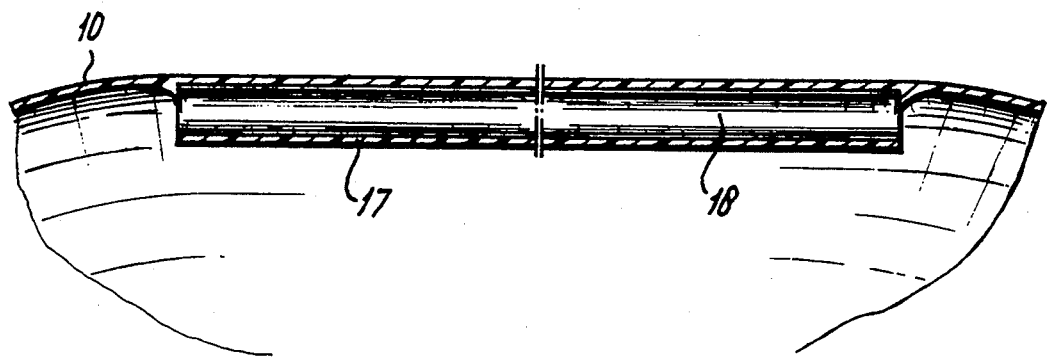
FIG. 4 illustrates a partial cross section through the balloon wall and through one of the coil conductors.

FIG. 4 illustrates a cross section through a part of the wall of the balloon 10 near one of the protrusions 17. In said protrusion or rib 17 a relatively stiff tubular coil conductor 18 is embedded. Said coil conductor forms a channel through which the wire of the coil, which will be described hereinafter, is guided. Because of the stiffness of the coil conductor the shape thereof will not change irrespective of the pressure with which the balloon will be inflated, the shape of the coil at the location of the coil conductors will be well defined. The respective parts of the coil extend rectilinear and are mutually parallel.

Figure 5:
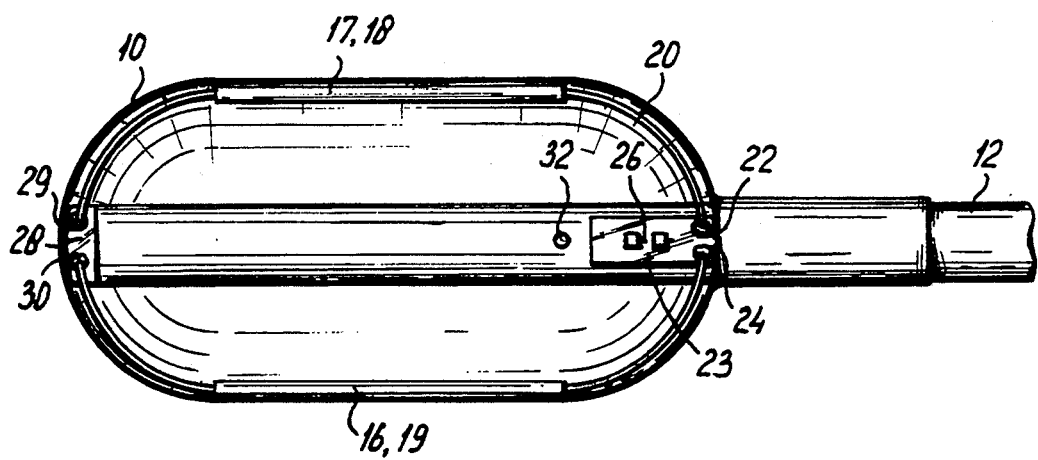
FIG. 5 illustrates a cross section through the coil/balloon combination according to the invention in the non-inflated condition.

The coil itself is in more detail illustrated in FIG. 5. This figure shows a longitudinal cross section just above the elongated shaft 12 according to the arrows V—V in FIG. 1. The coil comprises a wire 20 which at the proximal end of the balloon at the terminals 22 and 24 is connected to the communication cable which is not visible in the figure and runs through the lumen in the elongated shaft to said terminals. The terminals 22 and 24 are located on a mounting plate 23, which for instance by means of an adhesive is attached to the outer wall of the shaft 12. This mounting plate can be used if necessary for mounting a capacitor between the proximal ends of the coil 20 as is schematically indicated with reference 26 in FIG. 5. The coil wire 20 runs further through the two tubular coil conductors 18 and 19 which are positioned in the preformed elongated protruding sections 16 and 17 at the outer wall of the balloon 10. At its distal end the coil wire is connected to the elongated shaft 12, through a mounting plate 28 carrying the terminals 29 and 30. Also the mounting plate 28 is, for instance by means of an adhesive, attached to the outer wall of the shaft 12. Eventually, the mounting plate 28 may comprise further terminals for attaching a capacitor between the respective distal ends of the coil 20.

In FIG. 5 furthermore the opening 32 is visible through which the inflating gas, which is supplied through the lumen 11, may reach the inner space of the balloon 10 to inflate said balloon.

What is claimed is:

1. A probe for insertion into a body cavity of a patient, comprising:
   (a) an elongated shaft having a proximal end and a distal end, comprising at least one lumen, extending from the proximal end of the shaft to near the distal end of the shaft, wherein the lumen leads to an opening in the shaft;
   (b) an inflatable balloon having a proximal section and a distal section, constructed of flexible material, positioned around the distal end of the shaft, such that the distal and proximal sections of the balloon are connected to the elongated shaft thereby sealing the balloon, and such that the opening in the shaft communicates with the inner space of the balloon and may be used to inflate or deflate the balloon by introducing or removing respectively as through the lumen;
   (c) a coil comprising a loop-shaped flexible wire attached to the balloon, the ends of said wire being connected to a communication cable running through a lumen in the shaft, wherein the communication cable comprises means for connecting the coil to a magnetic resonance system for making images within the body cavity of the patient; and
   (d) two elongated tubular stiff coil conductors which are attached to the balloon such that when the balloon is inflated both coil conductors extend parallel to the shaft and part of the coil extends through the coil conductors.

2. A probe assembly according to claim 1, wherein the balloon comprises at its inner wall two inwardly directed elongated ribs, in each of which one of said coil conductors is at least partly embedded.

3. A probe assembly according to claim 2, wherein the two coil conductors are just embedded over their overall length and do not extend outside said elongated ribs.

4. A probe assembly according to claim 2 or 3, wherein both near the distal section as well as near the proximal section of the balloon the coil is supported by mounting plates, which are attached to the elongated shaft.

* * * * *

UNITED STATES PATENT AND TRADEMARK OFFICE
CERTIFICATE OF CORRECTION

PATENT NO. : 5,413,104

DATED : May 9, 1995

INVENTOR(S) : Buijs et al.

It is certified that error appears in the above-indentified patent and that said Letters Patent is hereby corrected as shown below:

Col. 1, following the title, insert as a heading --INTRODUCTION--;

Col. 1, following line 25, insert as a heading --BACKGROUND OF THE INVENTION--;

Col. 2, line 49, "embedded at least partly." should read --at least party embedded. According to one nonlimiting embodiment, the two coil conductors are just embedded over their overall length and do not extend outside said elongated ribs.--;

Col. 4, line 43, "as through" should read --a gas through--.

Signed and Sealed this

Ninth Day of July, 1996

Attest:

BRUCE LEHMAN

Attesting Officer

Commissioner of Patents and Trademarks